United States Patent [19]
Klemmer

[11] Patent Number: 6,124,740
[45] Date of Patent: Sep. 26, 2000

[54] LOW POWER CLASS AB UNITY GAIN BUFFER CIRCUIT

[75] Inventor: Nikolaus Klemmer, Apex, N.C.

[73] Assignee: Ericsson Inc., Research Triangle Park, N.C.

[21] Appl. No.: 09/122,453

[22] Filed: Jul. 24, 1998

[51] Int. Cl.[7] .................................................. H03K 3/00
[52] U.S. Cl. .............................. 327/109; 327/581; 326/83
[58] Field of Search ........................... 327/108–112, 581, 327/560–563; 330/252, 255, 257, 260, 262, 277, 288, 293, 273, 296; 326/26–28, 82–91

[56] References Cited

U.S. PATENT DOCUMENTS

| | | | |
|---|---|---|---|
| 3,974,456 | 8/1976 | Rusell et al. | 330/300 |
| 4,573,021 | 2/1986 | Widlar | 330/273 |
| 5,552,741 | 9/1996 | Kolluri | 327/560 |

OTHER PUBLICATIONS

Microelectronic Circuits, Adel Sedra et al. The ideal op amp pp. 70–71, 1982.

*Primary Examiner*—Terry D. Cunningham
*Assistant Examiner*—Minh Nguyen
*Attorney, Agent, or Firm*—Wood, Phillips, VanSanten, Clark & Mortimer

[57] ABSTRACT

A circuit for providing unity gain buffering of an input signal with reduced power consumption and symmetrical load driving capability. A feedback circuit between a buffer transistor and a bias circuit modulates the bias current to the buffer transistor. Modulating the bias current allows the buffer circuit to have a smaller quiescent bias current and increased current sink capability than the prior art unity gain buffer circuit. The modulating bias current allows more efficient operation of the buffer circuit while maintaining symmetrical load driving capability.

14 Claims, 8 Drawing Sheets

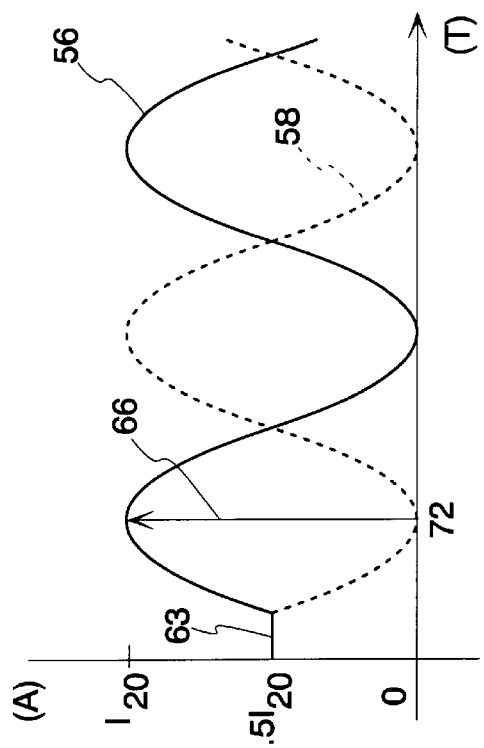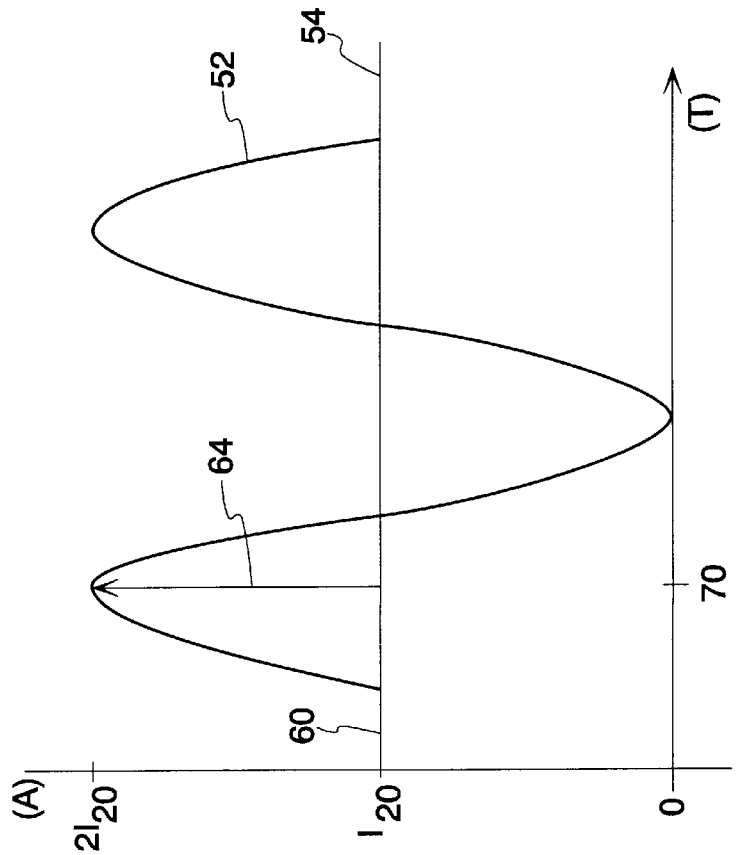

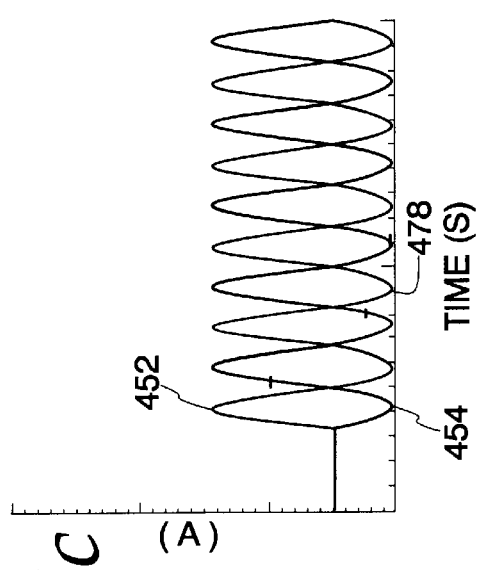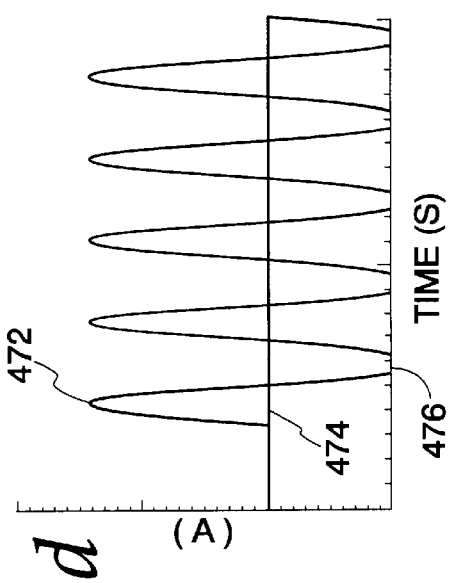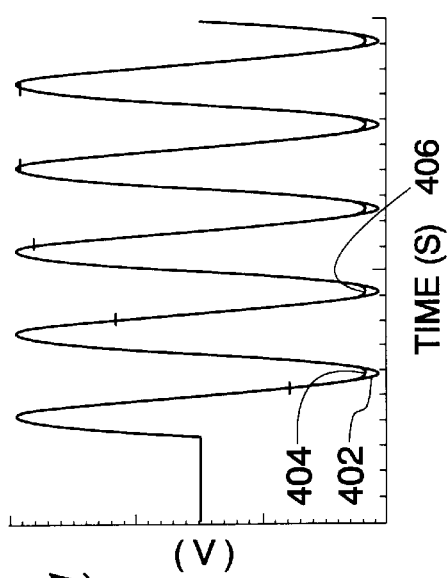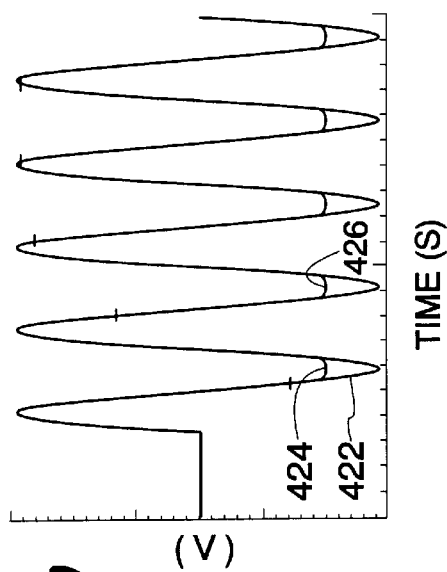

LOW POWER CLASS AB UNITY GAIN BUFFER CIRCUIT

FIELD OF THE INVENTION

The present invention is directed to a circuit for providing unity gain buffering of a signal with reduced power consumption and increased symmetrical load driving capability.

BACKGROUND OF THE INVENTION

The common solution for driving an analog signal from an integrated circuit (IC) into an external load is a unity gain buffer circuit. Unity gain buffer circuits generally consist of an emitter follower buffer transistor and a current mirror circuit. The current mirror circuit is itself usually two transistors, a current source transistor coupled to a reference transistor, where the current source transistor provides a bias current for the emitter follower buffer transistor.

In a system where an analog signal is driven from an IC into an external load, available supply power is often limited. For example, in a circuit operating from a battery power supply, reduced power requirements are desired. A class A emitter follower buffer circuit requires a bias current equal to the peak output current to prevent clipping of the output waveform during the negative half-wave of a signal. The bias current is constant for both the positive and negative half-waves of the input signal, causing unnecessary power dissipation.

For an emitter follower unity gain buffer circuit, the output current driving capability is asymmetric. During the positive half of a signal input into the buffer transistor, the output voltage and current of the buffer transistor increase. Because the output impedance of the buffer transistor is very low, the output voltage from the buffer transistor is almost identical to the input voltage and a very high peak output current can be supplied to the load. However, during a negative half of a signal input into the buffer transistor, the emitter follower unity gain buffer circuit must sink the current that flows from the load back into the output node of the buffer circuit. The maximum sink current is limited to the magnitude of the bias current supplied by the current source device. Therefore, when a symmetrical waveform is required by the load, the maximum output current cannot exceed the bias current supplied by the current source device.

SUMMARY OF THE INVENTION

It is an object of this invention to provide a unity gain buffer circuit with improved symmetrical current-driving capability. A feedback circuit between the buffer transistor and the current source cause Class AB operation of the buffer circuit by varying the bias current supplied by the current source according to the output current through the buffer transistor. As the output current through the buffer transistor increases, the feedback circuit decreases the bias current from the current source. As the output current through the buffer transistor decreases, the feedback circuit increases the bias current from the current source, providing greater current sink capability into the buffer circuit, thereby providing greater symmetrical current driving capability.

It is a further object of this invention to reduce the power consumption of a unity gain buffer circuit. Reduced power consumption is achieved as the feedback circuit between the buffer transistor and the current source varies the bias current, allowing the buffer circuit to be designed with a smaller quiescent bias current than that of the prior art buffer circuit.

In one aspect of the invention, a unity gain buffer circuit comprises a transistor having control, input and output elements. A bias circuit is connected with the output element to establish a bias current through the transistor. An output circuit, including the input and output elements, is connected with the load. A signal source is connected with the control element, and an output current in the output circuit varies in accordance with a signal from the signal source. A feedback circuit connected between the output circuit and the bias circuit varies the bias current in accordance with the output current.

In another aspect of the present invention, the transistors may be bipolar junction transistors (BJT), field effect transistors (FET), metal oxide semiconductor field effect transistors (MOSFET), or metal semiconductor field effect transistors (MESFET).

In another aspect of the present invention, the feedback circuit includes a current sensor connected between an operating power source and an input node to the buffer transistor, and a coupling circuit between the current sensor and the bias circuit.

In yet another aspect of the invention, the current sensor is a resistor.

In another aspect of the invention, the coupling circuit is a capacitor.

In another aspect of the invention, the bias circuit includes a current mirror circuit comprising a current source connected to the output element of the buffer transistor and a current mirror reference connected to said current source.

In yet another aspect of the invention, the current mirror circuit further comprises an impedance connected between the current source and the current mirror reference for increasing the impedance looking into the current mirror reference.

In yet another aspect of the invention, the current mirror circuit further comprises a compensator connected between the current source and the current mirror reference for providing compensation for noninfinite current gain.

BRIEF DESCRIPTION OF THE DRAWINGS

FIGS. 3A–B are plots of currents for the circuits of FIGS. 1 and 2 with a sine wave input.

FIGS. 6A–D are plots of voltages and currents for the circuits of FIGS. 1 and 2 with a sine wave input and resistive load;

DETAILED DESCRIPTION OF THE INVENTION

Figure 1:
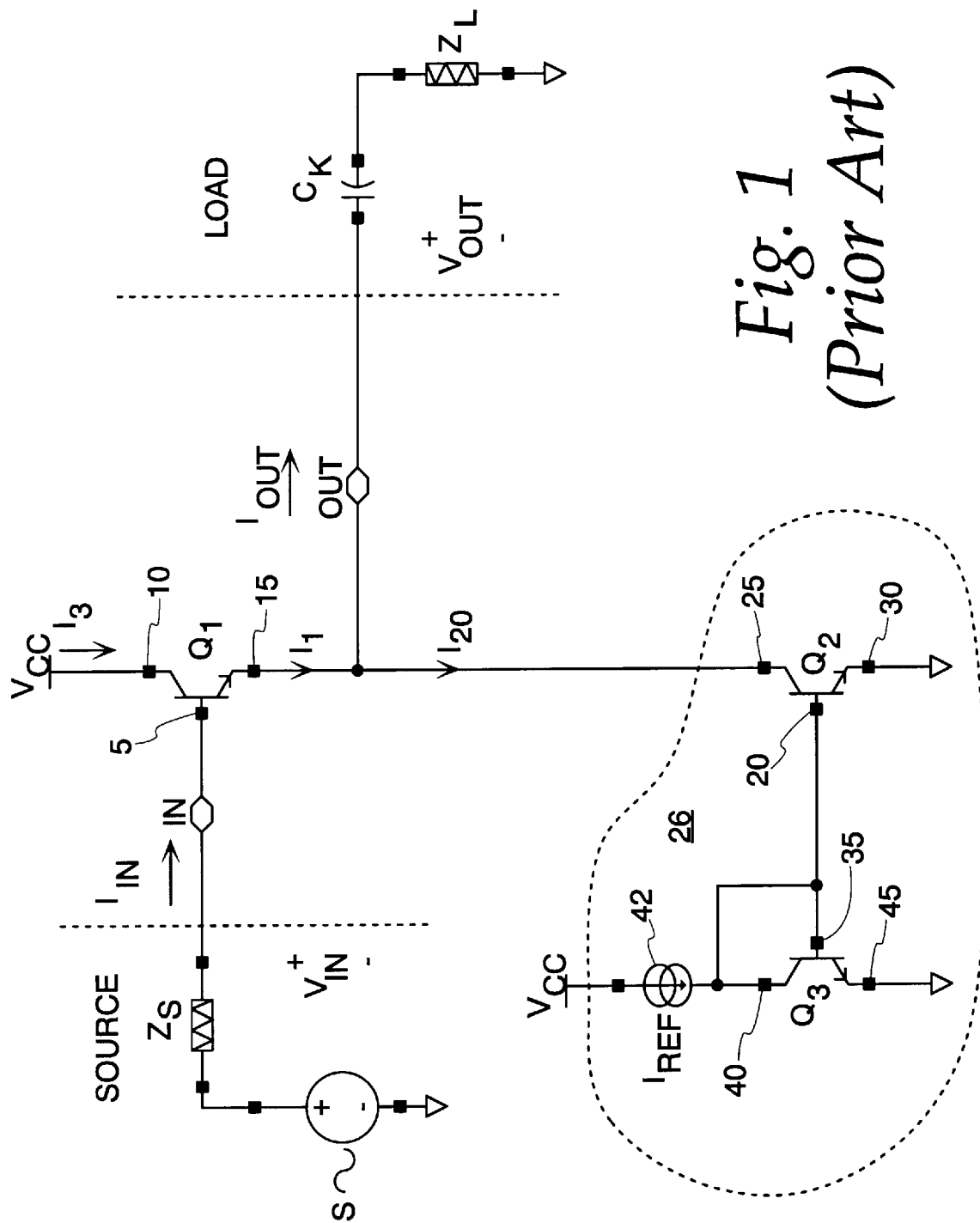
FIG. 1 is a schematic drawing of a prior art emitter follower unity gain buffer circuit.

In the prior art Class AB buffer circuit of FIG. 1, signal source S with impedance $Z_s$ supplies an input signal $I_{IN}$ to the input node IN, which is connected to the base or control element 5 of a buffer BJT Q1. Q1 is biased by a current mirror circuit 26 comprising a current source BJT Q2, and a current source reference BJT Q3. BJT Q1 has a collector or input element 10 connected to an operating power source Vcc, and an emitter or output element 15 connected to an output node OUT. Collector current $I_3$ is equal to $\beta I_{IN}$, where $\beta$ is the current gain of BJT Q1. Emitter current $I_1=I_{IN}+I_3$, and because $I_{IN}<<I_3$, $I_1$ is virtually equal to $I_3$.

The collector element 25 of current source BJT Q2 is connected to emitter element 15 and provides the bias current 120 for Q1. Base elements 20 and 35 of current source Q2 and current source reference Q3, respectively, are connected together. Because collector element 40 of Q3 is connected to base element 35 of Q3, bias current $I_{20}$ mirrors a reference current $I_{REF}$, which flows into collector element 40 and is supplied by a current generator 42 for current mirror circuit 26. Bias current $I_{20}$ remains constant while the buffer circuit is powered. The emitter elements 30 and 45 of Q2 and Q3, respectively, are both connected to ground.

The output node OUT is connected through coupling capacitor $C_K$ to a load $Z_L$. An output current $I_{out}$ flows from the output node OUT, where $I_{out}=I_1-I_{20}$. $I_{out}$ is limited as the bias current $I_{20}$ must be greater than $I_{OUT}$ yo prevent clipping of the output waveform $I_{OUT}$.

Figure 2:
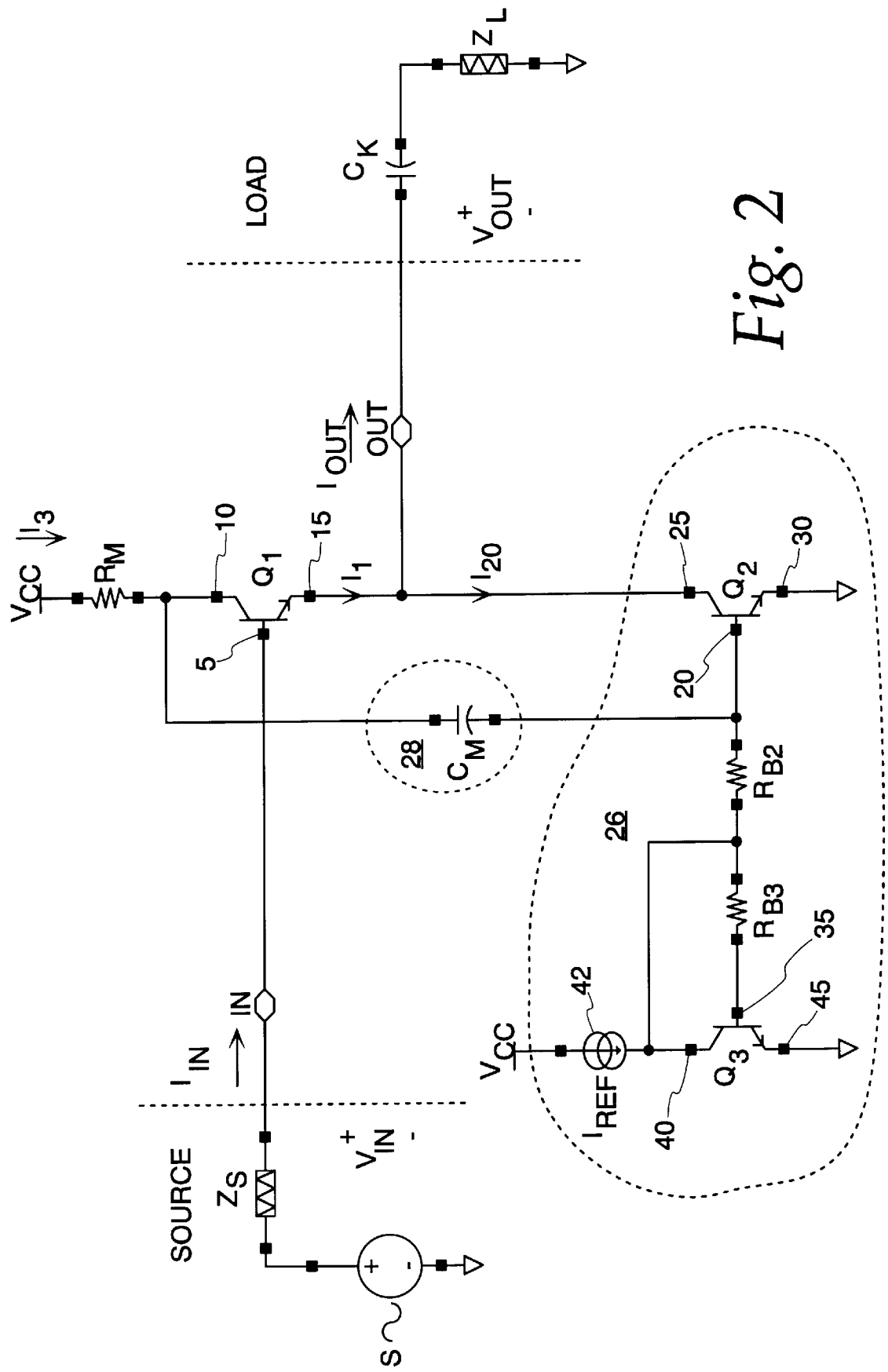
FIG. 2 is a schematic drawing of a junction transistor emitter follower feedback buffer circuit in accordance with the invention.

The emitter follower buffer circuit of FIG. 2 has a feedback circuit 28 connected to the current mirror 26 which varies the bias current 120, providing greater symmetrical current driving capability while increasing power efficiency. Components of FIG. 2 which correspond with components identified in FIG. 1 have the same identification and a detailed description will not be repeated. A current sensor resistor $R_M$ is connected between Vcc and the collector element 10 of Q1 and senses the collector current $I_3$ flowing into the collector element 10 of Q1. Coupling capacitor $C_M$ is connected between collector element 10 of Q1 and base element 20 of Q2, and forms the feedback circuit 28 which couples the voltage at the collector element 10 of Q1 to the base element 20 of Q2. This feedback voltage varies bias current $I_{20}$.

Resistor $R_{B2}$ connected between base element 35 of Q3 and coupler $C_M$ increases the impedance from the feedback circuit looking into Q3. $R_{B2}$ causes the feedback current to flow into the base element 20 of Q2 and not the base element 35 of Q3.

Resistor $R_{B3}$ connected between the base element 35 of Q3 and $R_{B2}$, compensates for non-infinite current gain of practical bipolar devices. $I_{REF}$ is provided by a current generator 42 for the current mirror circuit 26. $R_{B3}$ causes more of $I_{REF}$ to flow into the base element 20 of Q2 than the base element 35 of Q3, thereby increasing the bias current $I_{20}$ to the value of $I_{REF}$ provided by the current generator 42.

A principal advantage of the class AB buffer with feedback circuit 28 over the prior art circuit of FIG. 1 is that by modulating the bias current $I_{20}$ 180 degrees out of phase with the emitter current $I_1$, it supplies the same output current $I_{OUT}$ but requires only one-half the quiescent bias current $I_{20}$.

The operation of the prior art buffer of FIG. 1 and the class AB buffer circuit with feedback of FIG. 2 is compared in FIGS. 3A and 3B for circuits with a resistive load.

FIG. 3A shows emitter current 52 and steady-state bias current 54 waveforms for the buffer circuit of FIG. 1. The quiescent bias current 60 for the prior art buffer circuit is equal to $I_{20}$. The output current 64 is equal to the emitter current less the bias current. The output current 64 at time 70 is $2 I_{20}-I_{20}$ which is equal to $I_{20}$.

FIG. 3B shows emitter current 56 and modulating bias current 58 waveforms for the buffer circuit with feedback circuit of FIG. 2. The quiescent bias current 63 for the buffer circuit of FIG. 2 is $0.5 I_{20}$. Modulating bias current 58 is 180 degrees out-of-phase from the emitter current 56. The output current 66 is equal to emitter current 56 less bias current 58. The output current 66 at time 72 is $1.1 I_{20}-0.1 I_{20}$ which is equal to $I_{20}$. Thus, the circuit of FIG. 2 has the same output current driving capability as the prior art circuit of FIG. 1 while requiring only one-half the quiescent bias current. This occurs because of the modulating nature of the bias current.

The bias current is modulated by the feedback circuit 28. When an input signal $I_{IN}$ at the input node IN increases, with a resistive load the emitter current $I_1$ increases. The collector current $I_3$ increases by approximately the same amount. The voltage drop across $R_M$ increases, reducing the potential at collector element 10. The reduced potential is coupled to the base element of Q2 by $C_M$, decreasing the bias current $I_{20}$.

When the input signal to input node IN decreases, emitter current $I_1$ decreases. The collector current $I_3$ decreases by approximately the same amount. As $I_3$ decreases, the voltage drop across $R_M$ decreases, increasing the potential at the collector element 10. The increased potential is coupled to the base element of Q2 by $C_M$, increasing the bias current $I_{20}$.

The buffer circuit of FIG. 2 operates more efficiently than the prior art buffer of FIG. 1 as it requires one-half the quiescent bias current as the prior art buffer circuit of FIG. 1. The efficiency of a circuit is signified by the circuits Power Added Efficiency (PAE). PAE is a measurement of the ratio of the signal output power and the DC power required to provide the signal output power. The PAE of the prior art circuit of FIG. 1 is: $PAE_{PriorArt}=Pout_{MAX}/P_{DC}$, where $Pout_{MAX}$ is the maximum power output from the prior art buffer circuit, and $P_{DC}$ is the DC supply power required to provide $Pout_{MAX}$ to the load. Assuming for simplicity a sine wave input signal $I_{IN}$ and resistive load $R_L$, $PAE_{PriorArt}= \frac{1}{2}((R_L I_{20})Vcc)$.

The PAE of the emitter follower buffer circuit of FIG. 2 assuming a sinusoidal input signal and real load $R_L$ is $PAE_{FEED}=(R_L I_{20})Vcc$, which is twice the PAE of $PAE_{PriorArt}$. The emitter follower unity gain feedback buffer circuit achieves increased PAE because the modulating bias current $I_{20}$ allows the emitter follower unity gain feedback buffer circuit to be designed using one-half the quiescent bias current of the prior art buffer circuit while maintaining the same output current driving capability as the prior art buffer circuit.

Figure 4:
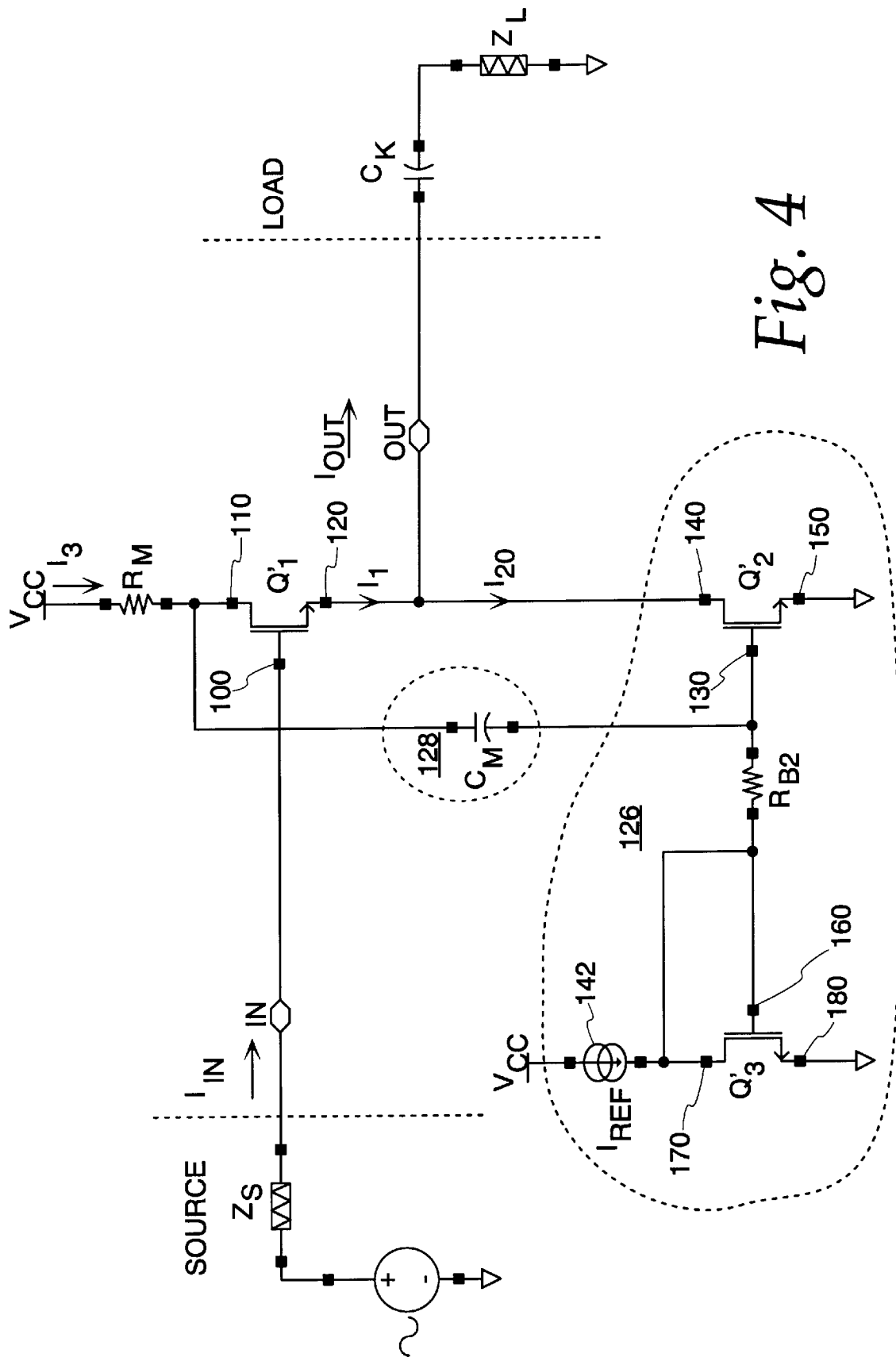
FIG. 4 is a schematic drawing of an enhancement-mode metal oxide semiconductor transistor source follower feedback buffer circuit in accordance with the invention.

FIG. 4 is a schematic drawing of a Class AB enhanced metal oxide semiconductor field effect transistor (MOSFET) source follower buffer with a feedback circuit. Components of FIG. 4 which correspond to components of FIG. 2 have the same identification and a detailed description will not be repeated. MOSFET Q1' has a gate or control element 100 connected to input node IN for receiving input signal $I_{IN}$. The drain or input element 110 of MOSFET Q1' is connected through current sensor $R_M$ to power source Vcc. The source or output element 120 of MOSFET Q1' is connected to output node OUT.

The drain element 140 of current source MOSFET Q2' is connected to the source element 120 of MOSFET Q1' and provides the bias current $I_{20}$ for Q1'. The gate elements 130 and 160 of current source Q2' and current source reference Q3' respectively are connected together through $R_{B2}$. The drain element 170 of Q3' is connected to the gate element 160 of Q3' and the bias current 120 mirrors a reference current $I_{REF}$, which flows into the drain element 170 and is supplied by a current generator 142 for current mirror circuit 126. The source elements 150 and 180 of Q2' and Q3' respectively are connected to ground.

The bias current $I_{20}$ for the MOSFET circuit of FIG. 4 is varied by the feedback circuit 128 in the same way as in the BJT buffer circuit of FIG. 2. The PAE of the MOSFET buffer circuit shown in FIG. 4 assuming a sinusoidal input signal and real load $R_L$ is $PAE_{MOS}=(R_L I_{20})Vcc$, the same as the PAE of the BJT buffer circuit of FIG. 2, which is twice the PAE of $PAE_{PriorArt}$ of FIG. 1.

Figure 5:
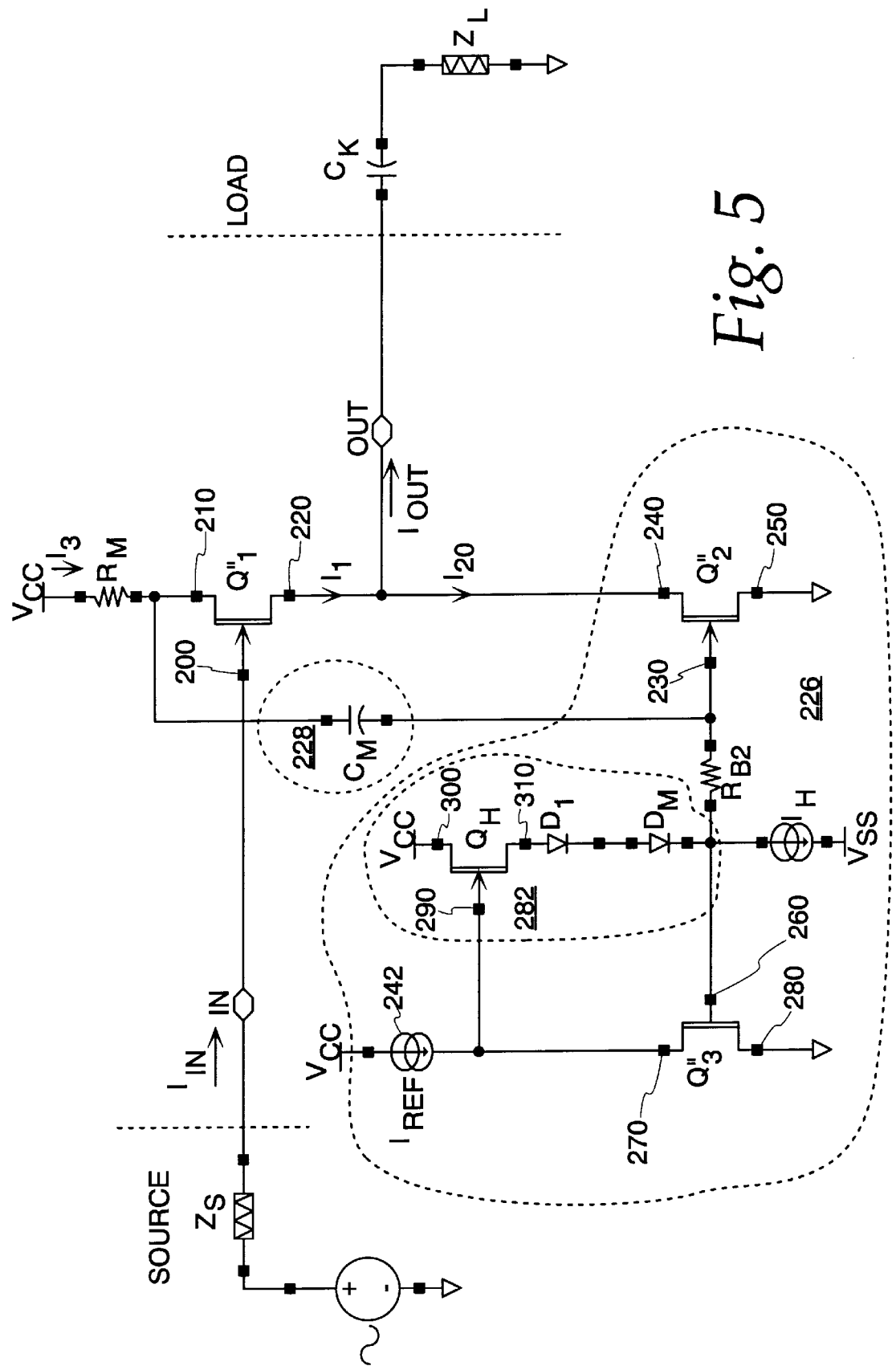
FIG. 5 is a schematic drawing of a depletion mode metal semiconductor transistor source follower feedback buffer circuit in accordance with the invention.

FIG. 5 is a schematic drawing of a Class AB depletion mode metal semiconductor field effect transistor (MESFET) source follower buffer with a feedback circuit. Components of FIG. 5 which correspond to components of FIG. 2 have the same identification and a detailed description will not be repeated. MESFET Q1" has a gate or control element 200 connected to input node IN for receiving input signal $I_{IN}$. The drain or input element 210 of MESFET Q1" is connected through current sensor $R_M$ to power source Vcc. The source or output element 220 of MESFET Q1" is connected to output node OUT.

The drain element 240 of current source MESFET Q2" is connected to the source element 220 of MESFET Q1" and provides the bias current $I_{20}$ for Q1". The gate elements 230 and 260 of current source Q2" and current source reference Q3" respectively are connected together through $R_{B2}$. The drain element 270 of Q3" is connected to the gate element 260 of Q3" through a level shifter circuit 282, part of current mirror circuit 226 and comprising a MESFET $Q_H$, and Diodes $D_1$ through $D_M$ where $D_1$ through $D_M$ typically represents three diodes. Gate element 290 of $Q_H$ is connected to drain 270, drain element 300 of $Q_H$ is connected to a power supply Vcc, and source element 310 Of $Q_H$ is connected to the anode of diode $D_1$. The diodes $D_1$ through $D_M$ are connected in series, where the cathode of $D_1$ is connected to the anode of $D_2$, the cathode of $D_2$ is connected to the anode of $D_M$, and the cathode of $D_M$ is connected to the gate element 260 of Q3". The level shifter circuit 282 insures that MESFET Q3" operates in the saturation mode. Current source $I_H$ is connected between the gate element 260 of Q3" and power supply Vss, and biases the level shifter circuit 282. Power supply Vss may be any negative voltage. The bias current $I_{20}$ mirrors a reference current $I_{REF}$, which flows into the drain element 270 of Q3" and is supplied by a current generator 242 for the current mirror circuit 226. The source elements 250 and 280 of Q2" and Q3" respectively are both connected to ground.

The bias current $I_{20}$ for the MESFET circuit of FIG. 5 is varied by the feedback circuit in the same way as in the BJT buffer circuit of FIG. 2. The PAE of the MESFET buffer circuit shown in FIG. 5 assuming a sinusoidal input signal and real load $R_L$ is $PAE_{MOS}=(R_L I_{20})Vcc$, the same as the PAE of the BJT buffer circuit of FIG. 2, which is twice the PAE of $PAE_{PriorArt}$ of FIG. 1.

In order to maximize PAE for the buffer circuits of FIGS. 2, 4 and 5, the currents $I_1$ and $I_{20}$ must be of equal amplitude and remain 180 degrees out-of-phase with one another. To accomplish this, $gm_2 Rx=1$, where $gm_2$ is the transconductance of the current source transistor and Rx is the equivalent resistance of impedance increaser $R_{B2}$ in parallel with current sensor $R_M$ (which is generally equal to $R_M$ as it is preferred that $R_{B2} >> R_M$).

The feedback circuits in the buffers of FIGS. 2, 4 and 5 may introduce instability. However, when the preferred design choice causing $I_1$ to be 180 degrees out-of-phase with $I_{20}$ is chosen where $gm_2 Rx=1$, the loop gain is only −6 dB and decreases as frequency increases. Therefore, the minimum gain margin is 6 dB and instability is prevented.

The operation of the feedback buffer of FIG. 2 is compared with that of the buffer of FIG. 1 for a resistive load and sine wave input, in the curves of FIGS. 6A–D, where the resistive load is an overload condition for the buffer of FIG. 1. FIGS. 6A and 6C show voltage and current waveforms respectively for the buffer circuit of FIG. 2. FIGS. 6B and 6D show voltage and current waveforms respectively for the buffer of FIG. 1.

FIG. 6A shows input voltage 402 and output voltage 404 for the unity gain buffer circuit of FIG. 2. Voltages 402 and 404 are in phase with one another and of equal amplitude, resulting in voltage 402 being superimposed over voltage 404.

FIG. 6B shows input voltage 422 and output voltage 424 for the unity gain buffer circuit of FIG. 1. Voltages 422 and 424 are in phase with one another, however, clipping is seen during the negative-half of the voltage 424 waveform at 426.

The clipping at 426 is a result of the prior art buffer of FIG. 1 being unable to provide adequate bias current $I_{20}$ to sink the current $I_{OUT}$ entering the output node OUT during the negative half-wave of the input signal $I_{IN}$. Virtually no clipping is seen during the negative-half of the voltage 404 waveform at 406. This is a result of the varying bias current $I_{20}$ for the unity gain feedback circuit of FIG. 2. $I_{20}$ increases during the negative-half of the input signal $I_{IN}$ allowing the buffer circuit of FIG. 2 to sink the current entering the output node OUT, preventing clipping.

FIG. 6C shows emitter current $I_1$ at 452 and bias current $I_{20}$ at 454 for the buffer circuit of FIG. 2. Bias current 454 varies and is 180 degrees out of phase with emitter current 452.

FIG. 6D shows emitter current $I_1$ at 472 and bias current $I_{20}$ at 474 for the buffer circuit of FIG. 1. Clipping of the emitter current 472 is seen at time 476, and is a result of the constant bias current 474. When emitter current 472 exceeds twice the value of the bias current 474, the bias current 474 is unable to sink the current entering the output node OUT during the negative half-wave of the input signal $I_{IN}$. No clipping of emitter current 452 is seen at time 478 for the negative half-wave of the input signal $I_{IN}$. This is a result of the varying bias current 454 for the unity gain feedback circuit of FIG. 2. Bias current 454 increases during the negative-half of the input signal $I_{IN}$ allowing the buffer circuit of FIG. 2 to sink the current entering the output node OUT, preventing clipping.

When used with a capacitive load, the performance of the buffer circuits of FIGS. 2, 4 and 5 is improved over that of the prior art buffer circuit of FIG. 1 because the feedforward loop in the unity gain feedback buffer circuit operates on a measured output current through current sensor $R_M$.

Figure 7A:
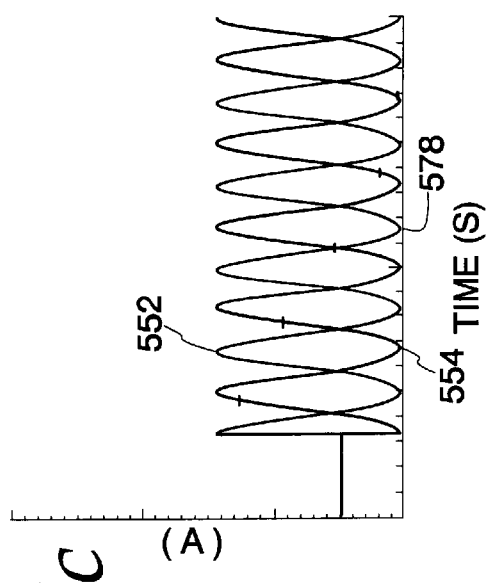
FIGS. 7A–D are plots of voltages and currents for the circuits of FIGS. 1 and 2 with a sine wave input and capacitive load.
Figure 7B:
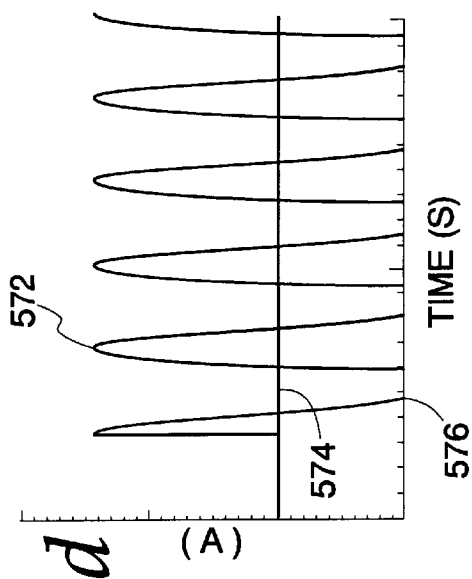
Figure 7C:
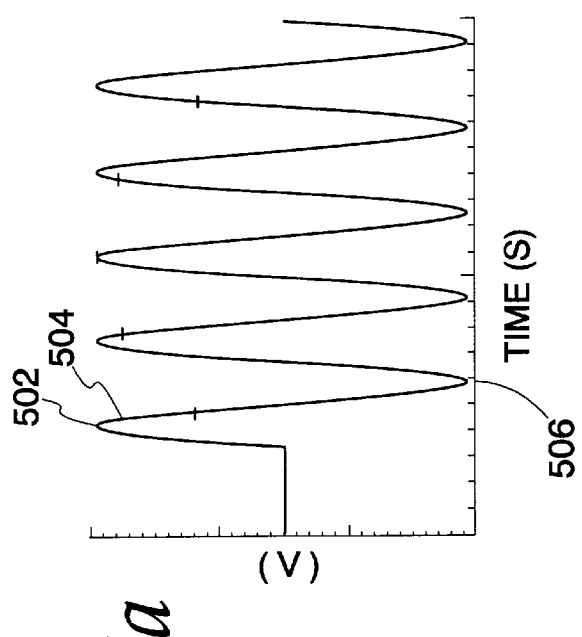
Figure 7D:
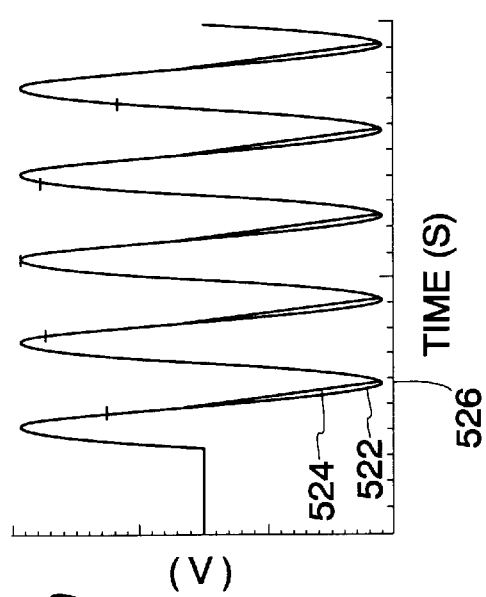

The operation of the feedback buffer of FIG. 2 is compared with that of the buffer of FIG. 1 for a capacitive load which is an overload condition for the buffer of FIG. 1, and a sine wave input, in the curves of FIGS. 7A–D. FIGS. 7A and 7C show voltage and current waveforms respectively for the buffer circuit of FIG. 2. FIGS. 7B and 7D show voltage and current waveforms respectively for the buffer of FIG. 1.

FIG. 7A shows input voltage 502 and output voltage 504 for the unity gain buffer circuit of FIG. 2. Voltages 502 and 504 are in phase with one another and of equal amplitude, resulting in voltage 502 being superimposed over voltage 504.

FIG. 7B shows input voltage 522 and output voltage 524 for the unity gain buffer circuit of FIG. 1. Voltages 522 and 524 are in phase with one another, however, slewing is seen during the negative-half of the voltage 524 waveform at time 526.

The slewing at time 526 is a result of the prior art buffer of FIG. 1 being unable to provide adequate bias current $I_{20}$ to sink the current $I_{OUT}$ entering the output node OUT during the negative half-wave of the input signal $I_{IN}$. The capacitive component of $Z_L$ stores a charge during the positive-half of the input signal $I_{IN}$. During the negative-half of the input signal $I_{IN}$, the charge stored by the capacitive component of $Z_L$ must be discharged before the voltage can drop. Because the bias current $I_{20}$ is limited, it takes time to discharge the charge stored in the capacitive component of $Z_L$ which causes the change in voltage 524 to lag behind the change in voltage 522. No stewing is seen during the negative-half of the voltage 504 waveform at time 506. This is a result of the varying bias current $I_{20}$ for the buffer with feedback circuit of FIG. 2. $I_{20}$ increases during the negative-half of the input signal $I_{IN}$ allowing the buffer circuit of FIG. 2 to discharge the charge stored by the capacitive component of $Z_L$ allowing voltage 504 to drop at the same time as voltage 504.

FIG. 7C shows emitter current $I_1$ at 552 and bias current $I_{20}$ at 554 for the buffer circuit of FIG. 2. Bias current 554 varies and is 180 degrees out of phase with emitter current 552.

FIG. 7D shows emitter current $I_1$ at 572 and bias current $I_{20}$ at 574 for the buffer circuit of FIG. 1. Clipping of the emitter current 572 is seen at time 576, and is a result of the constant bias current 574 of FIG. 1. When the emitter current 572 exceeds twice the value of the bias current 574, the bias current 574 is unable to sink the current entering the output node OUT during the negative half-wave of the input signal $I_{IN}$. No clipping of emitter current 552 is seen at time 578 for the negative half-wave of the input signal $I_{IN}$.

This is a result of the varying bias current 554 for the buffer with feedback circuit of FIG. 2. Bias current 554 increases during the negative-half of the input signal $I_{IN}$ allowing the buffer circuit of FIG. 2 to sink the current entering the output node OUT, preventing clipping.

During large signal operation where linear approximation is not applicable, the nature of the transfer functions for the buffer transistor and the current source allow the unity gain feedback buffer circuit to perform better than the prior art unity gain buffer circuit. The transfer functions lead to a higher increase in current during the positive half-wave of the input signal than the decrease in the negative half-wave of the input signal which does lead to some clipping of the output signal, however the clipping is less than that for the prior art unity gain buffer circuit for the same input signal.

Figure 8A:
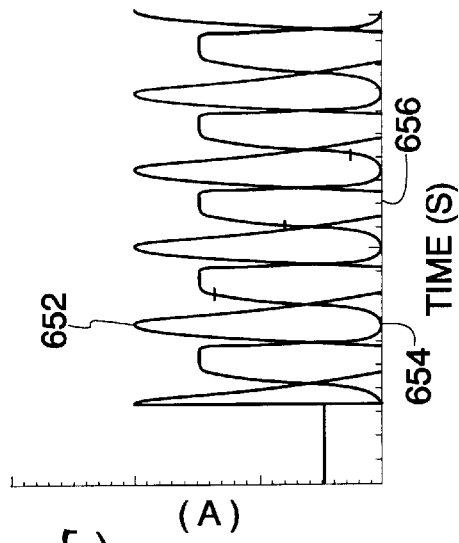
FIGS. 8A–D are plots of voltages and currents for the circuits of FIGS. 1 and 2 with a sine wave input and capacitive overload.
Figure 8B:
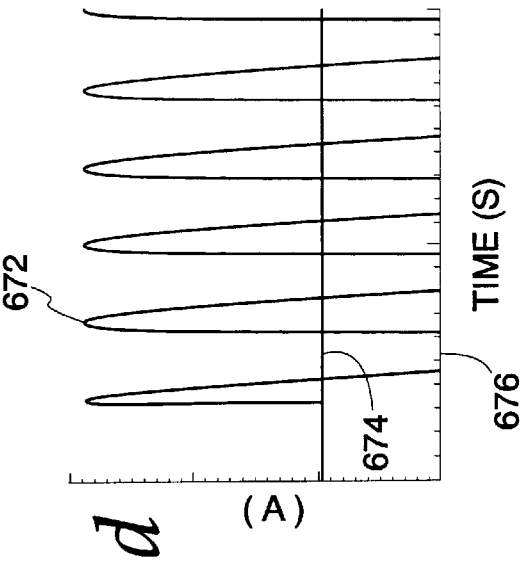
Figure 8C:
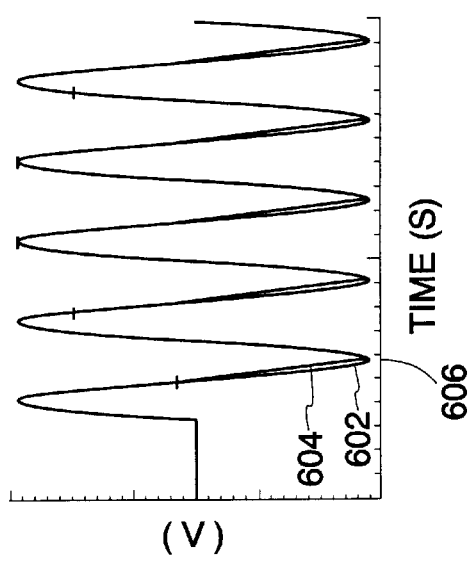
Figure 8D:
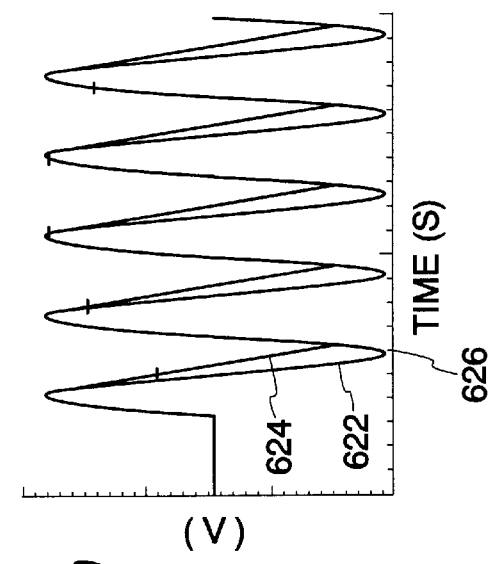

The operation of the feedback buffer of FIG. 2 is compared with that of the buffer of FIG. 1 for large signal operation with a capacitive load and a sine wave input, which is an overload condition for the buffer of FIG. 1 and the buffer of FIG. 2 in the curves of FIGS. 8A–D. FIGS. 8A and 8C show voltage and current waveforms respectively for the buffer circuit of FIG. 2. FIGS. 8B and 8D show voltage and current waveforms respectively for the buffer of FIG. 1.

FIG. 8A shows input voltage 602 and output voltage 604 for the unity gain buffer circuit of FIG. 2. Voltages 602 and 604 are in phase with one another and of equal amplitude, resulting in voltage 602 being superimposed over voltage 604. Slight stewing is seen for voltage 604 at time 606. This stewing is caused in the same way as the slewing of voltage 524 discussed in conjunction with FIG. 7B and will not be discussed here.

FIG. 8B shows input voltage 622 and output voltage 624 for the unity gain buffer circuit of FIG. 1. Voltages 622 and 624 are in phase with one another, however, stewing greater than the slewing of voltage 604 of FIG. 8A is seen during the negative-half of the voltage 624 waveform at time 626.

The slewing of voltage 624 is greater than the stewing of voltage 604 because the bias current $I_{20}$ for the prior art buffer of FIG. 1 is less than the bias current $I_{20}$ for the buffer circuit of FIG. 2 during the negative-half of the input signal $I_{IN}$. The smaller bias current $I_{20}$ of FIG. 1 prevents the prior art buffer of FIG. 1 from discharging the charge in the capacitance component of $Z_L$ as efficiently as the buffer circuit of FIG. 2 is able to.

FIG. 8C shows emitter current $I_1$ at 652 and bias current $I_{20}$ at 654 for the buffer circuit of FIG. 2. Bias current 654 varies and is 180 degrees out of phase with emitter current 652. Clipping of emitter current 652 is seen at time 656, and is caused by the inability of the varying bias current 654 of FIG. 2 to provide a sink current as great as the amount of current entering the output node OUT of the buffer circuit of FIG. 2.

FIG. 8D shows emitter current $I_1$ at 672 and bias current $I_{20}$ at 674 for the buffer circuit of FIG. 1. Clipping of the emitter current 672 is seen at time 676, and is greater than the clipping of emitter current 652 of FIG. 8C. The increased clipping of emitter current 672 over that of emitter current 652 is a result of the constant bias current 674. Because the value of the bias current 674 of FIG. 1 remains constant during the negative-half of the input signal $I_{IN}$ bias current 674 of FIG. 1 is unable to sink as much current entering the output node OUT during the negative-half of the input signal $I_{IN}$ as varying bias current 654 of FIG. 2. This leads to clipping of emitter current 672 greater than the clipping of emitter current 652.

What is claimed is:

1. A Class AB unity gain buffer circuit, comprising:
   a transistor having control, input and output elements;
   an operating power source connected with said input and output elements;
   a bias circuit comprising a basic current mirror including a current source directly connected to said output element of said transistor, and a current mirror reference connected to said current source, where the current source establishes a bias current through said transistor;
   an output circuit, including said input and output elements of said transistor;
   a load, connected with said output circuit;
   a signal source connected with said control element of said transistor, an output current in said output circuit varying in accordance with a signal from said signal source; and
   a feedback circuit connected between said output circuit and said bias circuit for driving the basic current mirror to vary the bias current in accordance with the output current.

2. The Class AB unity gain buffer circuit of claim 1 wherein said transistor is a bipolar-junction transistor connected in an emitter follower configuration having base, collector and emitter elements corresponding to said control, input and output elements.

3. The Class AB unity gain buffer circuit of claim 1 wherein said transistor is a field effect transistor connected in a source follower configuration having gate, drain and source elements corresponding to said control, input and output elements.

4. The Class AB unity gain buffer circuit of claim 3 wherein said field effect transistor is a metal oxide semiconductor field effect transistor.

5. The Class AB unity gain buffer circuit of claim 3 wherein said field effect transistor is a metal semiconductor field effect transistor.

6. The buffer circuit of claim 5 wherein said basic current mirror circuit includes:

a level shifter connected between said operating power source and said current source, wherein said level shifter biases said current mirror reference to operate in a saturation mode.

7. The Class AB unity gain buffer circuit of claim 1 wherein said current source includes a current source control element and said current mirror reference includes a current mirror reference control element and said current mirror further comprises an impedance connected between said current mirror reference control element and said current source control element for increasing impedance looking into said current mirror reference.

8. The Class AB unity gain buffer circuit of claim 1 wherein said current mirror reference further comprises a compensator connected to said current mirror reference and said current source for providing compensation for non-infinite current gain.

9. The Class AB unity gain buffer circuit of claim 1 wherein said transistor is a first transistor and the current source is a second transistor having:

a control element connected to said current mirror reference;

an input element connected to said output element of said first transistor; and an output element connected to ground.

10. The Class AB unity gain buffer circuit of claim 1 wherein said current mirror reference is a third transistor having:

a control element connected to said current source;

an input element connected to said operating power source; and an output element connected to ground.

11. The Class AB unity gain buffer circuit of claim 1 wherein said current source includes a control element, and said feedback circuit comprises:

a current sensor connected between said operating power source and said input element of said first transistor for sensing a current entering said input element of said first transistor; and a coupling circuit connected between said current sensor and the control element for said current source, for coupling a voltage at said current sensor to the current source.

12. The Class AB unity gain buffer circuit of claim 11 wherein said current sensor consists of a resistor.

13. The Class AB unity gain buffer circuit of claim 11 wherein said coupling circuit is a capacitor.

14. The Class AB unity gain buffer circuit of claim 1 wherein said buffer circuit buffers signals from an application specific integrated circuit.

* * * * *